United States Patent
Mc Grew et al.

(10) Patent No.: US 6,570,089 B1
(45) Date of Patent: May 27, 2003

(54) AUTOMOTIVE ELECTRONICS CONTROL MODULE ENCLOSURE

(75) Inventors: Jeffrey L Mc Grew, Cicero, IN (US); Roy A. Visser, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/175,094

(22) Filed: Jun. 18, 2002

(51) Int. Cl.$^7$ ................................................ H02G 3/08
(52) U.S. Cl. .......................... 174/50; 174/61; 174/52.4; 220/3.2
(58) Field of Search ..................... 174/50, 52.1, 52.4, 174/17 R, 61, 54, 17 CT; 220/3.2, 3.3, 3.8, 4.02; 24/295, 289, 293

(56) References Cited

U.S. PATENT DOCUMENTS

| | | | | |
|---|---|---|---|---|
| 3,619,477 A | * | 11/1971 | Rasmussen | 174/56 |
| 3,873,757 A | * | 3/1975 | Berke et al. | 174/52.1 |
| 4,668,898 A | * | 5/1987 | Harms et al. | 310/227 |
| 4,837,406 A | * | 6/1989 | Emmons | 174/57 |
| 4,975,545 A | * | 12/1990 | China et al. | 174/52.1 |
| 5,276,278 A | * | 1/1994 | Lin | 174/52.1 |
| 5,550,712 A | * | 8/1996 | Crockett | 174/52.1 |
| 5,703,754 A | * | 12/1997 | Hinze | 174/52.1 |
| 5,760,336 A | * | 6/1998 | Wang | 174/52.1 |
| 5,837,934 A | * | 11/1998 | Valavanis et al. | 174/52.1 |
| 5,988,119 A | * | 11/1999 | Trublowski et al. | 123/41.31 |
| 5,998,738 A | * | 12/1999 | Li et al. | 174/250 |
| 6,003,586 A | * | 12/1999 | Beane | 164/63 |
| 6,045,140 A | * | 4/2000 | Morris, Jr. | 277/630 |
| 6,156,970 A | * | 12/2000 | Harting et al. | 174/17 LF |
| 6,192,570 B1 | * | 2/2001 | Traver et al. | 174/50.5 |
| 6,256,572 B1 | * | 7/2001 | Rea | 439/510 |

* cited by examiner

Primary Examiner—Dean A. Reichard
Assistant Examiner—Angel R. Estrada
(74) Attorney, Agent, or Firm—Jimmy L. Funke

(57) ABSTRACT

An engine control module 10 is provided, including a die-cast base portion 12 having a plurality of die cast post elements 24. A cover element 14 is positioned such that each of the plurality of die-cast post elements 24 project through a plurality of cover holes 34 formed in the cover element 14. The plurality of die-cast post elements 24 are staked such that the cover element 14 is secured to the base portion. 12.

19 Claims, 2 Drawing Sheets

AUTOMOTIVE ELECTRONICS CONTROL MODULE ENCLOSURE

TECHNICAL FIELD

The present invention relates generally to an automotive electronics control module enclosure (ECM hereafter). More specifically, the present invention relates to a die-cast automotive electronics control module enclosure with improved assembly characteristics.

BACKGROUND OF THE INVENTION

Die-cast products are well known in the prior art. Die-casting forces molten metal, typically under high pressure, into metal dies in order to create formed components. The resulting products are typically accurately dimensioned, sharply defined, and allow for both smooth and textured surfaces. Additionally the dies may be formed to create unique and complex design configurations that may prove impossible or financially unviable for creation utilizing other manufacturing techniques. Although the use of die-casting techniques have been adopted by a variety of industries, one industry that has successfully utilized die-casting is the automotive industry.

Automotive designers have commonly looked to die-casting to form a variety of parts and elements for automotive manufacture. One genre of products in which die-casting has made significant inroads within the automotive industry is the area of electronic enclosures. These enclosures must often be formed with complex shapes to appropriately secure the electronic components mounted inside them. Additionally, the enclosures must provide adequate structural protection to prevent damage to the electronic component from the hostile automotive environment. Heat dissipation and electromagnetic compatibility can also play a role in dictating the enclosure's configuration and material makeup. Die-casting allows each of the mentioned characteristics to be properly addressed while maintaining a low cost and flexible design process.

Although die-casting can be utilized to incorporate many structural features of an enclosure directly through the casting process, often features are machined or manufactured into the enclosure using post-die processes. Such is the case with present automotive electronics control module designs. Present automotive electronics control designs commonly utilize die-casting procedures to form the ECM housing (base) and sheet metal procedures to form the cover of enclosures. Adhesives may or may not be utilized to join the cover to the housing (base), and are sometimes used to provide an environmental seal to protect the electronics from automotive fluids. Additionally, screws are commonly used to secure the cover to the housing. Screws require either cored holes, or drilled holes in the die cast base in order to drive the screws through the clearance holes in the cover into the base enclosure. Typical problems with cored holes due to die cast tolerances include stripped holes from oversized holes, or unseated or broken screws from undersized holes. More die maintenance is required to assure properly sized holes due to the more rapid wearing of tool pins to form them. By utilizing a post die-casting procedure by drilling the holes, tighter tolerances can be achieved which help minimize scrap from stripped and/or unseated screws, however this is at additional cost due to the secondary operations required to the die cast. The use of screws also increases the cost of the enclosure due to the additional part cost of the screws, and the additional cost associated with handling and assembling the screws. Thus, although die-casting is utilized for general formation purposes, it is often combined with traditional manufacturing techniques that can serve to deplete the cost and time benefits provided by the die-casting.

In addition to the time and cost deficiencies associated with typical ECM enclosure manufacturing, present manufacturing techniques can add manufacturing concerns to the ECM enclosure. The drilling and driving of screws is capable of producing metal shavings that can find their way to the substrate or the connector cavity of the ECM. These metal shavings present a danger of creating electrical shorts and ECM malfunction, which is clearly unacceptable. Instead of screws, complex cover tab geometries may be utilized to form the edges of the cover over the base, thereby eliminating the concerns with screw usage. The complex cover tab geometry, however, is often associated with increased cover tooling costs and increased manufacturing costs associated with bending or clinching the tabs. The tab geometries on the cover also result in larger size covers to accommodate the tab geometry, thus resulting in higher material cost.

It would therefore be highly desirable to have an ECM enclosure that preserved the benefits associated with die-casting techniques, while improving upon the post casting manufacturing procedures usually required to assembly the ECM. Furthermore, it would be highly desirable to have an ECM enclosure that could be manufactured and assembled without the risks of electrical shorts associated with screw attachment methodologies.

SUMMARY OF THE INVENTION

It is, therefore, an object of the present invention to provide a die-cast ECM enclosure with improved assembly characteristics. It is a further object of the present invention to provide a die-cast ECM enclosure with reduced assembly costs.

In accordance with the objects of the present invention, an automotive electronics control module assembly is provided. The automotive electronics control module includes an automotive electronics control module enclosure housing an electrical component. The automotive electronics control module enclosure has a die-cast base portion including a plurality of die-cast post elements. The automotive electronics control module enclosure further includes a cover element having a plurality of cover holes. The plurality of die-cast post elements are positioned within the plurality of cover holes during assembly. The plurality of die-cast post elements are staked (plastically deformed, partially crushed) to secure the cover element to the base portion.

Other objects and features of the present invention will become apparent when viewed in light of the detailed description of the preferred embodiment when taken in conjunction with the attached drawings and appended claims.

BRIEF DESCRIPTION OF THE DRAWINGS

1, the cross-section illustrating the die-cast post elements in a pre-staking condition.

DESCRIPTION OF THE PREFERRED EMBODIMENT(S)

Figure 1:
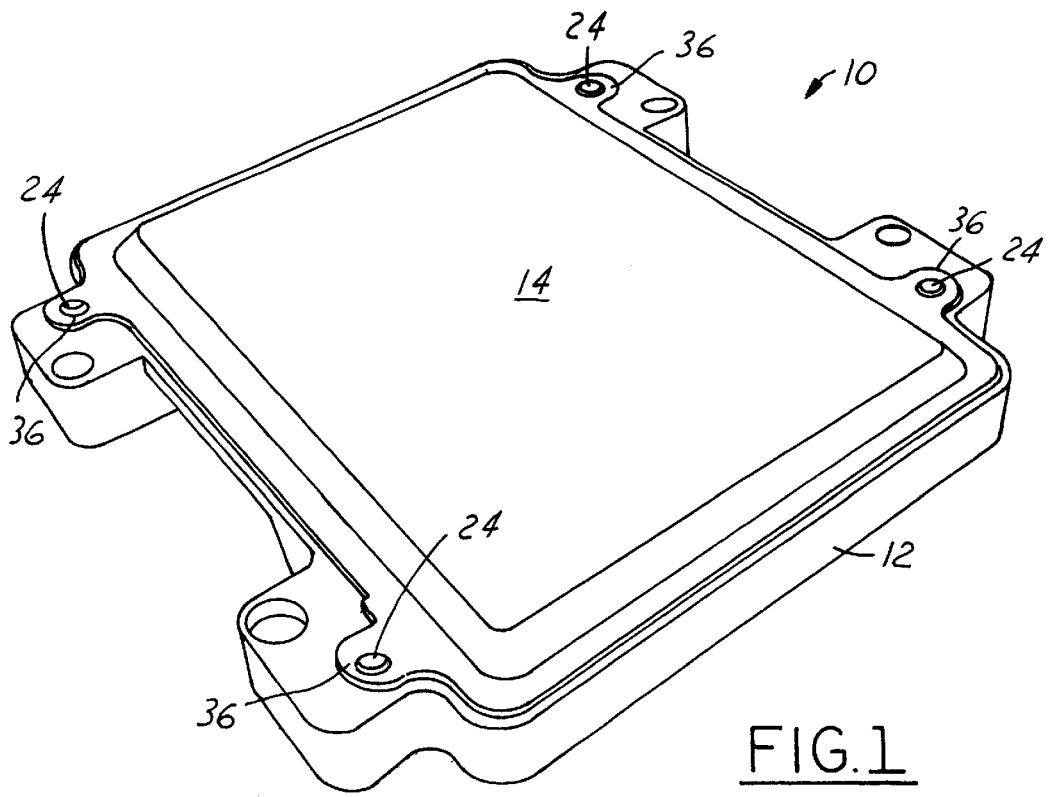
FIG. 1 is an illustration of an embodiment of an die-cast automotive electronics control module assembly in accordance with the present invention.

Referring now to FIG. 1, which is an illustration of an automotive electronics control module assembly 10 in accordance with the present invention. Although the automotive electronics control module assembly 10 is intended for use in an automobile, a wide variety of uses would become obvious to one skilled in the art. The automotive electronics control module assembly 10 includes a base portion 12 and a cover element 14. The base portion 12 is formed utilizing a die-cast manufacturing technique and the cover element 14 is formed utilizing a stamped sheet metal technique. Both die-cast and sheet metal manufacturing are well known techniques of manufacturing components. Although it is contemplated that a variety of materials may be utilized to form the base portion 12, in one embodiment it is contemplated that both may be formed utilizing die-cast aluminum or aluminum alloys.

Figure 2:
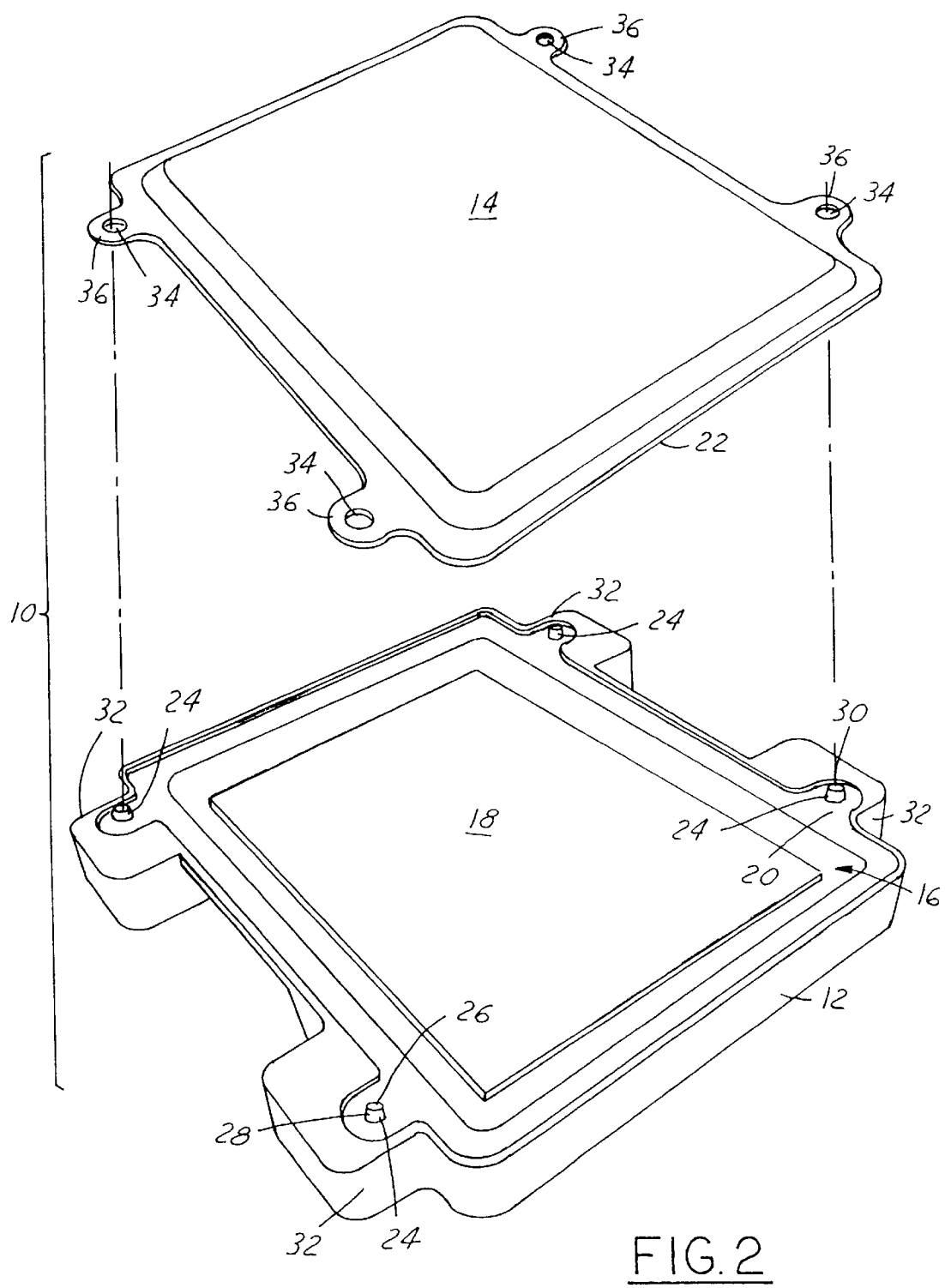
FIG. 2 is an exploded view illustration of the die-cast automotive electronics control module assembly illustrated in FIG. 1.

The base portion 12 is formed to create an enclosure 16. The enclosure 16 houses an electronics component 18 (see FIG. 2). The electronics component 18 is intended to be any one of a variety of components designed for use as an automotive electronics controller. The base portion can further include a placement depression 20 configured to be coincident with the outer profile 22 of the cover element 14. The base portion 12 further includes a plurality of post elements 24. Although a variety of methods are contemplated for forming the post elements 24, one embodiment contemplates die-casting the post elements 24 during die-casting of the base portion 12. Furthermore, it is contemplated the post elements 24 may be formed in a variety of shapes. In one embodiment, it is contemplated that the post elements 24 be cylindrical formations 26. One subset of such cylindrical formations involves cylinders with angled sidewalls 28. This geometric shape is also commonly referred to as a conic solid 30. The advantage of utilizing conic solids 30 with draft angle is that the geometry assists in the die cast process in releasing from the dies. Although the placement of the post elements 24 may be modified in a variety of fashions, however, placement in approximately the corner positions 32 of the base portion 12 is preferable. Furthermore, in at least one embodiment it is contemplated that the plurality of post elements 24 will be located within the placement depression 20.

Figures 3, 4:
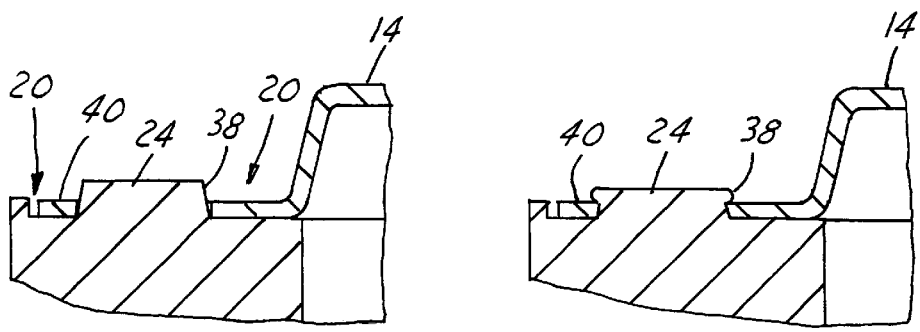
FIG. 3 is a cross-sectional detail of the die-cast automotive electronics control module assembly illustrated in FIG.
FIG. 4 is a cross-sectional detail of the die-cast automotive electronics control module assembly illustrated in FIG. 1, the cross-section illustrating the die-cast post elements in a post-staking condition.

The plurality of post elements 24 are paired with a plurality of cover holes 34 formed in the cover element 14. It is contemplated that the cover holes 34 may be formed in the cover element 14 in a variety of fashions. In one embodiment, the cover holes 34 are punched out during the stamping process in the fabrication of the cover element 14. In another embodiment, however, the cover holes 34 can be machined (such as drilled) into the cover element 14 in a stamping procedure. The plurality of post elements 24 are positioned within corresponding cover holes 34 during assembly of the automotive electronics control module assembly 10 (see FIG. 3). The raised posts 24 work in conjunction with the cover element holes 34 to provide alignment between the base 12 and the cover element 14. Although the cover holes 34 may be position in a variety of locations on the cover element 14, one embodiment contemplates placement of the cover holes 34 within projecting tabs 36 formed on the cover element 14. The use of projecting tabs 36 allows for the overall dimensions of the automotive electronics control module assembly 10 to be minimized while still allowing access to the post elements 24 to be accessed by automated machining processes.

The automotive electronics control module assembly 10 is then subjecting to a staking process. The post elements 24 are staked (plastically deformed, partially crushed), such that their post upper portion 38, projecting upwards through the cover holes 34 is swaged onto the cover upper surface 40 (see FIG. 4). This secures the cover element 14 onto the base portion 12 using simple manufacturing techniques. The staked, or crimped, post elements 24 do not generate metal shaving and therefore do not create the concerns for electrical shorts found in some prior art methods. When the post elements 24 are designed with simple geometry, of which one genre has been described but a variety is contemplated, they are easily cast into the base portion 12. This serves to minimize the cost of post die-cast machining often associated with prior methods. When the plurality of post elements 24 are formed as conic solids 30, the cover element 14 can be naturally held in proper alignment with or without the presence of a placement depression 20. Finally, the present invention can be utilized with present cover elements 14 utilizing existing screw clearance holes as the cover holes 34. This allows the present invention to be implemented with minimal cost to existing productions. It also allows rework of any damaged stake post 24 during assembly by drilling through the stake post 24 to create a hole for screw(s).

While particular embodiments of the invention have been shown and described, numerous variations and alternative embodiments will occur to those skilled in the art. Accordingly, it is intended that the invention be limited only in terms of the appended claims.

What is claimed is:

1. An engine control module assembly comprising:
   an electrical component;
   a die-cast base portion forming an enclosure, said electrical component positioned within said enclosure;
   a plurality of die-cast post elements cast into said die-cast base portion;
   a cover element including a plurality of cover holes, each of said plurality of die-cast post elements positioned in one of said plurality of cover holes; and
   a plurality of projecting tabs formed into said cover element, said plurality of cover holes positioned on said plurality of projecting tabs;
   wherein said plurality of die-cast post elements are staked to secure said cover element to said die-cast base portion.

2. An engine control module assembly as described in claim 1, wherein said plurality of die-cast post elements are cylindrical.

3. An engine control module assembly as described in claim 1, wherein said plurality of die-cast post elements are conic solids.

4. An engine control module assembly as described in claim 1, wherein said die-cast base portion and said cover portion are formed using an aluminum material.

5. An engine control module assembly as described in claim 1, wherein said plurality of cover holes are formed into said cover element using one of the group of operations including punched, die-cast, coined, or drilled.

6. An engine control module assembly as described in claim 1, further comprising:

a placement depression formed in said die-cast base portion, said placement depressor configured to be coincident with an outer profile of said die-cast cover element.

7. An engine control module assembly as described in claim 6, wherein said plurality of die-cast post elements are positioned within said placement depression.

8. An engine control module assembly as described in claim 1, wherein said plurality of die-cast post elements are positioned in corner positions on said die-cast base portion.

9. An electronics control module as described in claim 1, wherein each of said plurality of die-cast post elements includes a post upper portion projecting upwards through one of said plurality of cover holes, said post upper portions swaged onto a cover upper surface.

10. An electronics control module comprising:

a base portion including a plurality of post elements; and a cover element including a plurality of cover holes, each of said plurality of post elements positioned in one of said plurality of cover holes;

wherein each of said plurality of post elements includes a post upper portion projecting through one of said plurality of cover holes, said post upper portions swaged onto a cover upper surface to secure said cover element to said base portion.

11. An electronics control module as described in claim 10, wherein said base portion is die cast and said cover portion is stamped.

12. An electronics control module as described in claim 11, wherein said base portion and said cover portion are formed using an aluminum material.

13. An electronics control module as described in claim 10, wherein said plurality of post elements are die-cast into said base portion.

14. An electronics control module as described in claim 10, wherein said plurality of post elements are cylindrical.

15. An electronics control module as described in claim 10, wherein said plurality of post elements are conic solids.

16. An engine control module control module as described in claim 10, further comprising:

a placement depression formed in said base portion, said placement depression configured to be coincident with an outer profile of said cover element.

17. An engine control module enclosure as described in claim 16, wherein said plurality of post elements are positioned within said placement depression.

18. A method of assembling an engine control module comprising:

installing an electrical component within a die-cast base portion, said die-cast base portion including a plurality of post elements;

placing a cover element on said die-cast base portion such that each of said plurality at post elements project through one of a plurality of cover holes formed in said cover element;

staking said plurality of post elements such that a post upper portion of each of said plurality of post elements swages onto a cover upper surface such that said cover element is secured to said die-cast base portion.

19. A method as described in claim 18 further comprising:

die-casting said plurality at post elements onto said die-cast base portion.

* * * * *